United States Patent
Dick et al.

(10) Patent No.: US 6,333,649 B1
(45) Date of Patent: Dec. 25, 2001

(54) ERROR FEED-FORWARD DIRECT DIGITAL SYNTHESIS

(75) Inventors: Christopher H. Dick, San Jose; Frederic J. Harris, Lemon Grove, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/652,385

(22) Filed: Aug. 31, 2000

(51) Int. Cl.[7] .................................................. H03B 21/00
(52) U.S. Cl. ................................................ 327/105; 106/107
(58) Field of Search .................... 327/105, 106, 327/107; 708/270; 375/44

(56) References Cited

U.S. PATENT DOCUMENTS

| | | | |
|---|---|---|---|
| 4,652,832 | * | 3/1987 | Jasper ..................................... 328/14 |
| 4,893,316 | * | 1/1990 | Janc et al. ............................. 708/300 |
| 5,864,492 | * | 1/1999 | Sadot ................................. 364/718.01 |
| 5,999,581 | * | 12/1999 | Bellaouar et al. .................... 708/270 |

* cited by examiner

Primary Examiner—Tuan T. Lam
Assistant Examiner—Hiep Nguyen
(74) Attorney, Agent, or Firm—LeRoy D. Maunu

(57) ABSTRACT

A circuit arrangement and method for direct digital synthesis (DDS). In various embodiments, the invention feeds forward the phase error introduced by a quantizer in a DDS system. The error is fed forward to adjust the sine and cosine values that are obtained based on output from the quantizer. Correction of the sine and cosine values based on the fed-forward error values results in a significant reduction in the effect of spectral artifacts.

20 Claims, 8 Drawing Sheets

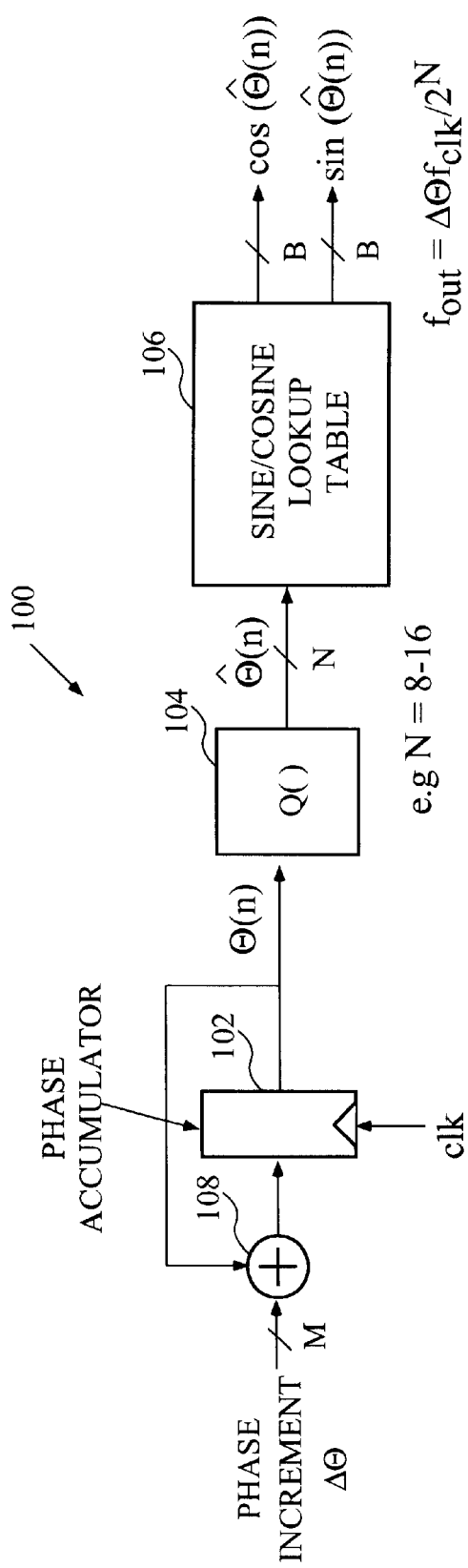
Fig. 1
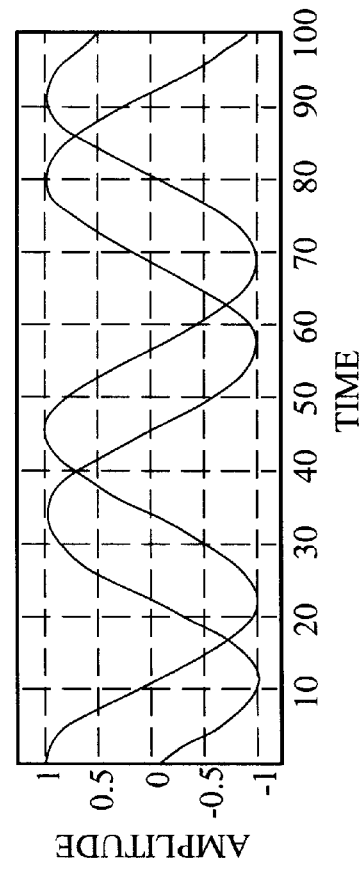
Fig. 2 Phase truncation DDS

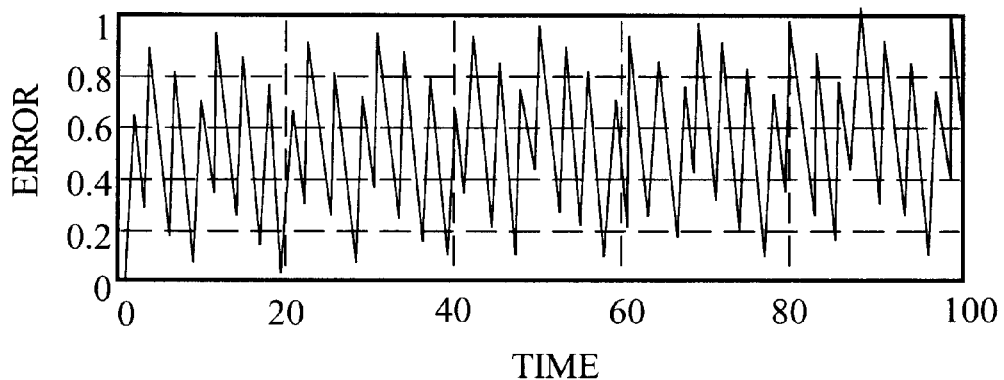
Fig. 3  Truncation DDS - phase error
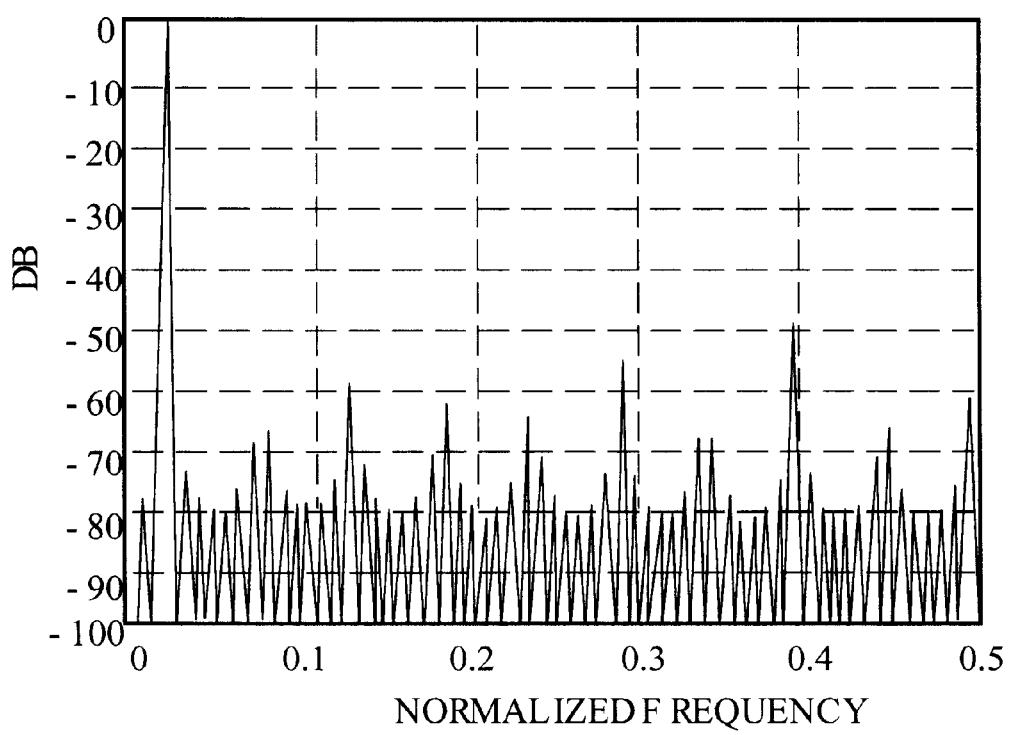
Fig. 4  DDS spectrum- truncation addressing

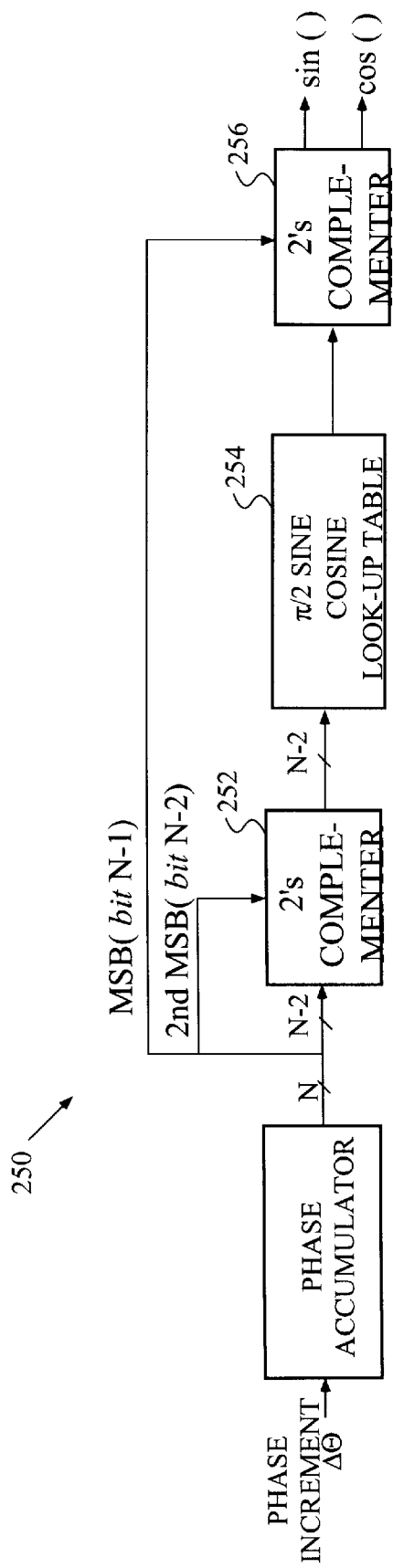
Fig. 6  DDS - exploiting quarter wave symmetry.

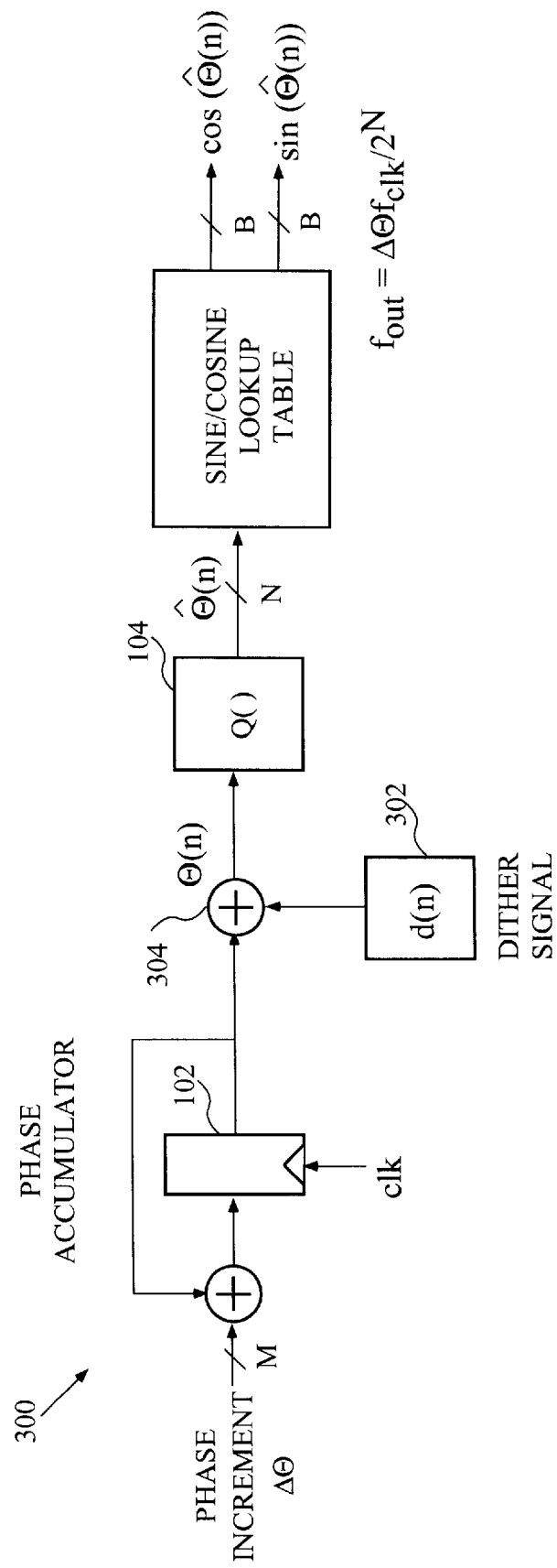
Fig. 7    DDS employing address dithering.

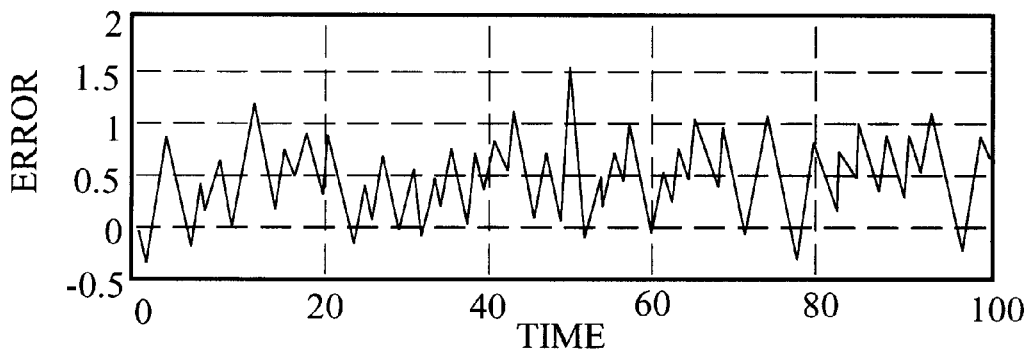
Fig. 8   Dithered DDS - phase error.
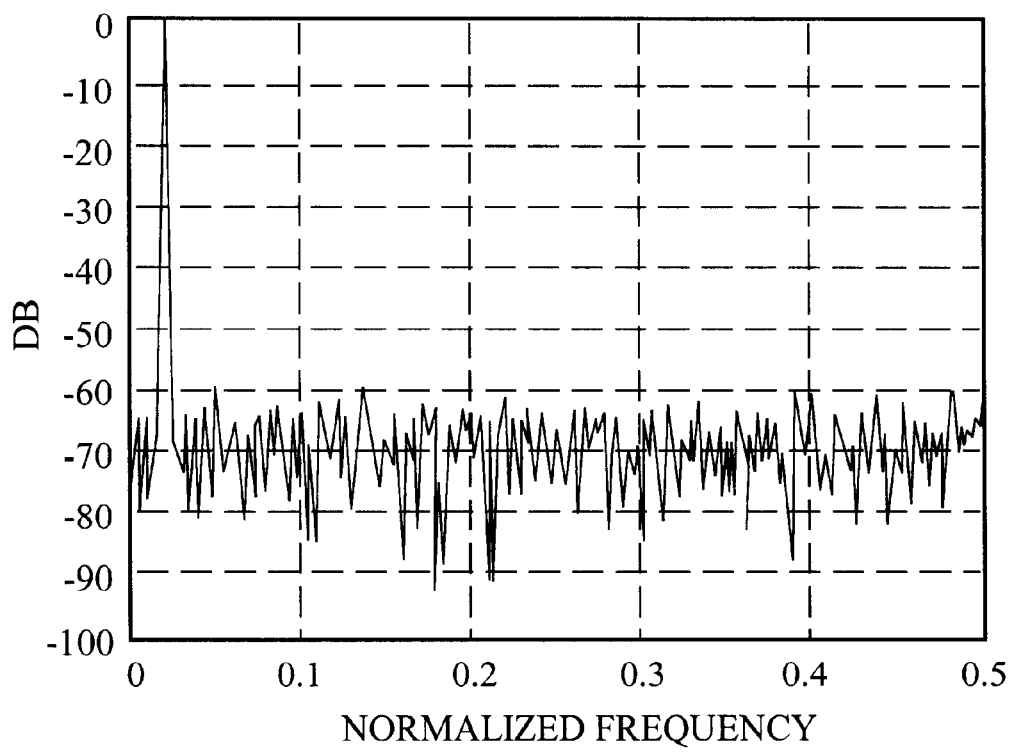
Fig. 9   DDS spectrum - dithered addressing.

ERROR FEED-FORWARD DIRECT DIGITAL SYNTHESIS

FIELD OF THE INVENTION

The present invention generally relates to direct digital synthesizers (DDSS) and more particularly to efficient implementations of DDSs in programmable logic devices.

BACKGROUND

Direct digital synthesizers (DDSs), or numerically controlled oscillators (NCOs), are a functional requirement of many digital communications systems, including modems and software defined radios. Frequency synthesis is commonly realized using application specific parts (ASSPs) or software executing on a digital signal processing (DSP) processor. With the increasing capabilities of PLDs, for example, field programmable gate arrays (FPGAs), DSP functions are increasingly being implemented on PLDs. PLDs have the advantages of speed that approaches the speed of ASIC implementations along with the programmability associated with DSP processors.

Quadrature oscillators (a type of DDS) are used for constructing digital down converters, demodulators, and various types of modulation schemes, such as phase shift keying, frequency shift keying, and minimum shift keying. With careful design, a DDS can also be used in systems that require frequency hopping and chirp waveform synthesis. One method for digitally generating a complex or real valued sinusoid employs a look-up table. The look-up table stores samples of a sinusoid, and a digital integrator is used to generate a suitable phase argument that is mapped by the look-up table to the desired output waveform.

The fidelity of a signal formed by recalling samples of a sinusoid from a look-up table is affected by both the phase and amplitude quantization of the process. The depth and width of the look-up table affect the signal's phase angle resolution and the signal's amplitude resolution respectively. The depth of the look-up table is the number of sample points stored therein, and the width of the look-up table is the number of bits used to represent each sample. These resolution limits are equivalent to time base jitter and to amplitude quantization of the signal. The resolution limits add spectral modulation lines and a white broad-band noise floor to the signal's spectrum.

It would therefore be desirable to implement a circuit arrangement that controls these undesired spectral terms, and which minimizes usage of logic resources.

SUMMARY OF THE INVENTION

A circuit arrangement and method for direct digital synthesis (DDS) are provided in various embodiments of the invention. The phase error introduced by a quantizer in a DDS system is fed forward and used to correct sine and cosine values output from a lookup table. Correction of the sine and cosine values based on the fed-forward error values results in a significant reduction in spectral artifacts.

In one embodiment, the circuit arrangement includes a phase accumulator, a quantizer, and a lookup table. The phase accumulator accumulates phase increment values, and the quantizer quantizes accumulated values. The quantized values are then used to address sine and cosine values in the lookup table. A feed-forward error-correction circuit determines a value for the error introduced by the quantizer and adjusts the sine and cosine values from the table as a function of the error value and sine and cosine values from the lookup table.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 1 is a block diagram of an example DDS employing phase truncation;

FIG. 2 is a graph that illustrates the complex output time series generated by a DDS;

FIG. 3 is a graph that illustrates the look-up table addressing error associated with a DDS as a function of time;

FIG. 4 is a graph that illustrates the normalized frequency spectrum of the complex sinusoid generated by a DDS;

FIG. 6 is a block diagram of a phase-truncated DDS that exploits quarter-wave symmetry;

FIG. 7 is a block diagram of a DDS that employs address dithering;

FIG. 8 illustrates the phase error signal associated with DDS;

FIG. 9 is a graph that illustrates the spectrum obtained from a dithered DDS;

DETAILED DESCRIPTION

Figure 5:
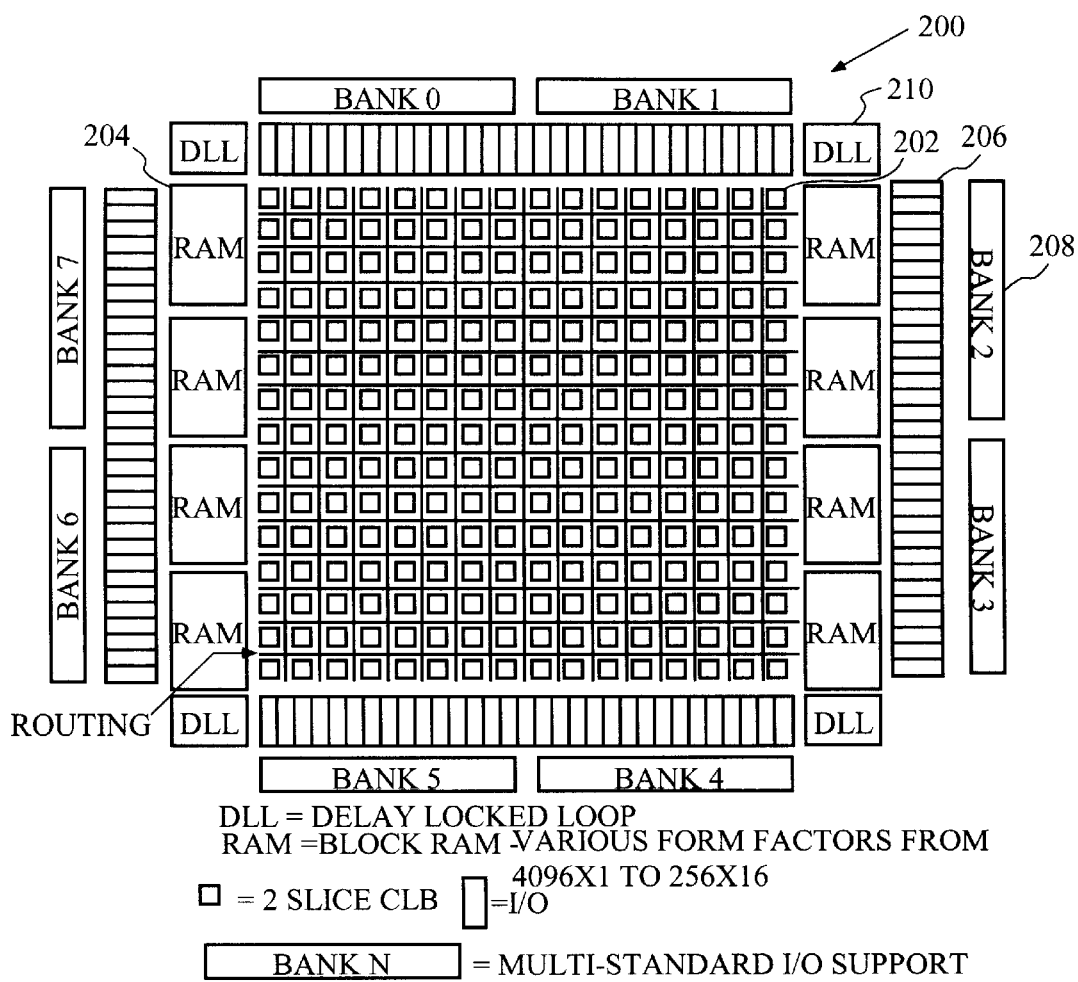
FIG. 5 is a block diagram of an example FPGA.

Three DDS arrangements are described below. First a standard phase truncation DDS is described; second, a dithered DDS is described; and third, an error feed-forward DDS is described. The mathematics behind the DDSs described herein are set forth in the paper entitled, "Direct Digital Synthesis—Some Options for FPGA Implementation" by Dick and Harris and published in the proceedings of the "SPIE International Symposium on Voice Video and Data Communication *Reconfigurable Technology: FPGAs for Computing and Applications Stream*" pp. 2–10, Sep. 19–22, 1999, attached hereto as an Appendix.

DDSs use an addressing scheme with an appropriate look-up table to form samples of an arbitrary frequency sinusoid. The DDS presents these samples to a digital-to-analog converter (DAC) and a low pass filter to obtain an analog waveform with the specific frequency structure. The samples are also commonly used directly in the digital domain. The look-up table traditionally stores uniformly spaced (time relative) samples of a cosine and a sine wave. Thus, the look-up table is comprised of a sine table and a cosine table. These samples represent a single cycle of a length N prototype complex sinusoid. N is the number of samples in the lookup table, which is referred to as the "depth" of the table.

By symmetries of samples of the sine and cosine waves, a half (or quarter) cycle of a sinusoid in each sinusoid, along with one or two bits for sign (or quadrant) demarcation are sufficient to define shortened tables. Two tables are normally accessed to form the ordered pair (cosine and sine) for applications requiring quadrature components.

In modeling the process, an accumulator must have sufficient bit-width to span the desired frequency resolution. For example, if the desired frequency resolution is 1 Hz with a sampling clock operating at 100 MHz ($f_s$=sample frequency, and the highest frequency is restricted to $0.25f_s$), $2.5*10^8$ phase slopes must be resolved. Since the phase slope is the input word to the accumulator, $\Delta\theta(n)$ ($\Delta\theta(n)$ is the phase angle increment value, and n is nth sinusoid argument), the dynamic range of the accumulator must span the interval of $2.5*10^8$ or the binary count $2^{28}$ which requires a 28-bit accumulator. Continuing the example with a 256-point table that is addressed by an 8-bit word, the contents of the 28-bit accumulator must be quantized to define the required 8-bit address.

The quantization of the accumulator value to address the look-up table is the cause of time base jitter. The jitter results in undesired phase modulation that is proportional to the quantization error.

FIG. 1 is a block diagram of an example DDS employing phase truncation. DDS 100 generally includes register 102, quantizer 104, and look-up table 106. A phase increment value is input to adder 108 and accumulated with the value stored in register 102. The new accumulated value is then stored in register 102 and provided as input to quantizer 104. Quantizer 104 produces an N bit address for referencing a cosine-sine pair in look-up table 106. The output data from look-up table 106 include cosine of $\hat{\zeta}(n)$, where $\hat{\zeta}(n)$ is the approximation of $\theta(n)$.

FIG. 2 is a graph that illustrates the complex output time series generated by DDS 100. The cosine and sine values are shown over a 100 unit time interval (100 values of n). FIG. 3 is a graph that illustrates the look-up table addressing error associated with DDS 100 as a function of time.

FIG. 4 is a graph that illustrates the normalized frequency spectrum of the complex sinusoid generated by DDS 100. The normalized frequency for the signal is 0.022 Hz, which corresponds to phase accumulation steps of 7.92 degrees per output sample. The angular resolution of the 256-point look-up table is 360/256, or 1.40625 degrees per address, which is equivalent to 7.92/1.40625 or 7.0549 addresses per output sample. Since the address must be an integer, the fractional part is discarded and the resultant phase jitter causes the spectral artifacts. Note that the fractional part of the address count is a periodic (sawtooth) error sequence which is responsible for the harmonic rich (and aliased) low level phase modulation. The peak distortion level due to incidental phase modulation is approximately 48 dB below the desired signal level, which is consistent with 6 dB/bit of address space.

FIG. 5 is a block diagram 200 of a Virtex™ FPGA from Xilinx, Inc. FPGA block diagram 200 is shown to compare the resource requirements of the various DDS implementations described herein. Those skilled in the art will appreciate that the DDS implementations could be comparably used when implemented on other PLDs.

FPGA 200 includes a plurality of configurable logic blocks (CLBs), each including two slices. Each slice includes two 4-input function generators (not shown). Eight block RAM elements 204 are provided for on-chip data storage. It will be appreciated that, even though 8 block RAM elements are illustrated in FPGA 200, the number of block RAM elements may be different for different devices.

There are a plurality of input/output blocks 206 (IOBs) arranged along each side of the matrix of CLBs 202. Connections can be configured between the IOBs and CLBs for input and output of signals. There are 8 banks 208 for mixing output voltage standards. Associated with each global clock input buffer is a fully digital Delay-Locked Loop (DLL) 210 that can eliminate skew between the clock input pad and internal clock-input pins throughout the device.

FPGA resource usage by DDS 100 is illustrated with the following example. Assume that register 102 has 28 bits, the address width of look-up table 106 is 8 bits, and the sample precision is 10 bits. Register 102 and adder 108 each require 14 slices, for a total of 28 slices.

Two implementation options are available for look-up table 106. The look-up table can be implemented in block RAM 204 or in distributed RAM (the 32 bits of memory in each look-up table) as configured with CLBs 202. The spurious free dynamic range (SFDR) of a phase truncation DDS is increased at a rate of approximately 6 dB per bit of the quantized phase accumulator. Thus, for the present example, assuming that the trigonometric samples are quantized to a suitable number of bits, the SFDR is expected to be 48 dB, which is illustrated in FIG. 4. The look-up table logic requirements can be minimized by exploiting the quarter wave symmetry of the output waveform.

FIG. 6 is a block diagram of a phase-truncated DDS that exploits quarter-wave symmetry. DDS 250 is distinguished from DDS 110 (FIG. 1) by 6-bit two's complementer 252, which receives the accumulated and quantized address. The address is presented to quarter cycle look-up table 254. DDS 250 also includes a 10-bit two's complementer 256, which processes output from table 254 to produce the final complex DDS waveform. Two's complementers 252 and 256 require 3 and 5 logic slices, respectively. To produce the complex output, two 64-sample tables are required, wherein each table requires 20 slices. Thus, DDS 250 can be implemented with 76 slices. Table 254 could be implemented with a single dual-port block RAM. with some savings in slices. The preceding implementation may be suitable if spectral purity of 48 dB is required. However, if a greater level of spectral purity is required, DDS 250 may not be suitable.

For example, if a design requires suppression of spurs by 96 dB, the desired results can be achieved by modifying DDS 100 such that table 106 is addressed by 16 bits and 18-bit samples are stored in table 106. Thus, table 106 would have 65,536 samples. Quarter-wave symmetry can be exploited to reduce the resource requirements for implementing the DDS. However, even with a quarter-wave implementation, look-up table 106 would include 16,384 samples and require 10,240 slices (or 20,480 for the complex quarter-wave look-up table). When considered relative to the largest Virtex FPGA from Xilinx having 12,288 slices, the phase-truncated DDS implemented on a PLD appears to be unsuitable for high spectral purity applications.

The phase error introduced by discarding the fractional part of the address is a periodic series which results in undesirable spectral line structure. This structure can be suppressed by breaking up the regularity of the address error with an additive randomizing signal. The randomizing sequence, called dither, is a noise sequence (having variance equal to the least significant bit) sometimes added to the accumulator output prior to quantization.

FIG. 7 is a block diagram of a DDS that employs address dithering. DDS 300 includes the same basic components as DDS 100, and in addition includes dither signal generator 302 and adder 304. Dither signal generator 302 generates a noise signal whose variance is equal to the least significant bit of $\hat{\zeta}(n)$. Adder 304 adds the dither signal to the output of accumulator register 102 prior to input to quantizer 104.

The dither signal must possess a Gaussian probability density function (PDF). A uniform PDF can be generated in hardware using a linear feedback shift register (LFSR). In one embodiment, output data from three 13-stage LFSRs can be averaged to generate the dither signal. Each LFSR can be implemented using a serial arrangement of flip-flops, and each modulo-2 adder can be implemented in a single function generator. The complete dither generator can be implemented using 40 slices.

FIG. 8 illustrates the phase error signal associated with DDS 300. Relative to the phase error signal associated with DDS 100 (as shown in FIG. 3), the phase error signal of DDS 300 is unstructured. That is, the phase error signal of DDS 100 has a periodic quality, whereas the phase error signal of DDS 300 is random.

FIG. 9 is a graph that illustrates the spectrum obtained from dithered DDS 300. Phase dithering effectively increases the output signal SFDR by an additional 12 dB over a truncation DDS. It can be seen that the spurs are approximately 60 dB down from the desired tone. Thus, for the incremental cost of dither signal generator 302 (40 slices) and adder 304, a DDS can be realized that provides higher spectral purity than a simple phase truncation DDS.

One way to view the tradeoffs between phase-truncated DDS 100 and dithered DDS 300 is that to provide the same performance as the dithered DDS 300, phase-truncated DDS 300 must quadruple the size of look-up table 106 (4×256=1024). Note that if a spur suppression of 48 dB is all that is required, there is an insubstantial difference between phase-truncating and dithering.

Another way to view the tradeoffs is where 96 dB spur suppression is required, the dithered DDS can achieve 96 dB spur suppression using a look-up table that is ¼ the size of the look-up table of the phase-truncated DDS. Thus, the look-up table of the dithered DDS would have 4096 samples stored across 5,120 slices or, alternatively, 18 elements of block RAM; whereas a phase truncated look-up table would have 16,384 samples stored across 20,480 slices.

While the dithered DDS greatly reduces FPGA resource usage over the phase-truncated DDS, consuming 5,000 slices or 18 block RAM elements to build an oscillator may be more than is desirable.

From the foregoing DDS implementations, it will be appreciated that the addressing error is non-random. Also, it has been recognized that that the addressing error is a known quantity. That is, the error is the difference between the input to the quantizer and the output from the quantizer. Since it is understood that:

$$e^{j\theta(n)}=e^{j\hat{\theta}(n)}e^{j\delta\theta(n)}$$

where $j^n$ is defined as $\cos(n)+j*\sin(n)$; j is the square root of −1; and $\delta\theta(n)$ represents the phase angle jitter introduced by truncation of the phase accumulator. Thus, $$e^{j\theta(n)}e^{-j\delta\theta(n)}$$

By employing a first order Taylor series approximation for:

$$e^{-j\delta\theta(n)}$$

the following first order approximation is obtained:

$$e^{j\theta(n)}=e^{-j\hat{\theta}(n)}[1-j\delta\theta(n)]$$

which in expanded form is:

$$e^{j\theta(n)}\approx[\cos(\hat{\theta}(n))+\delta\theta(n)\sin(\hat{\theta}(n))]+j[\sin(\hat{\theta}(n))-\delta\theta(n)\cos(\hat{\theta}(n))]$$

It will be appreciated that other embodiments could employ higher order approximations, for example, feed-forward DDS architectures that employ more terms in the Taylor series expansion of the term $e^{-j\delta\theta(n)}$.

Figure 10:
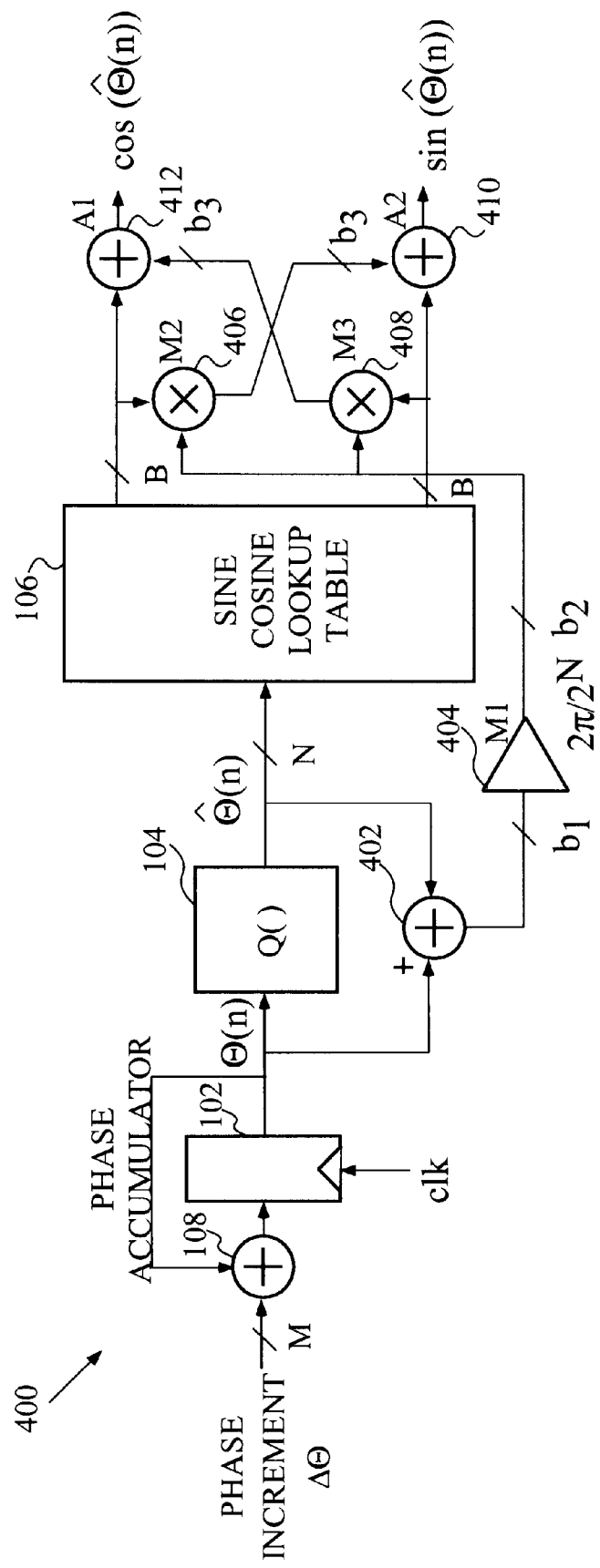
FIG. 10 is a block diagram of an error feed-forward DDS in accordance with one embodiment of the invention.

FIG. 10 is a block diagram of an error feed-forward DDS in accordance with one embodiment of the invention. DDS 400 includes the same basic components as DDS 100 of FIG. 1. However, DDS 400 also includes circuitry for finding the addressing error resulting from quantization and feeding forward the error to combine with the outputs from lookup table 106.

Subtracter 402 subtracts the output value of quantizer 104 from the input value to the quantizer. The difference is input to constant multiplier 404. Constant multiplier 404 stores the multiplicand $2\pi/2^N$ using 16 bits of precision, for example, and multiplies the constant by the error value. In one embodiment, the error value is computed to 12 bits of precision, and constant multiplier 404 is a 12-bit×16-bit multiplier. Through simulation it may be determined that other sizes of multipliers are desirable to suppress spectral artifacts in other applications. The product from multiplier 404 is provided as input data to multipliers 406 and 408.

Multiplier 406 multiplies the cosine value from lookup table 106 by the error product from multiplier 404, and multiplier 408 multiplies the sine value from lookup table 106 by the error product from multiplier 404. Output values from multipliers 406 and 408 are input to adders 410 and 412, respectively. Adder 410 adds the sine value from lookup table 106 to the value provided by multiplier 406, and adder 412 adds the cosine value from the lookup table to the value provided by multiplier 408. Each of multipliers 406 and 408 are 16-bit×16-bit multipliers in one embodiment. It will be appreciated, however, that other sizes of multipliers may be desirable for other applications.

Figure 11:
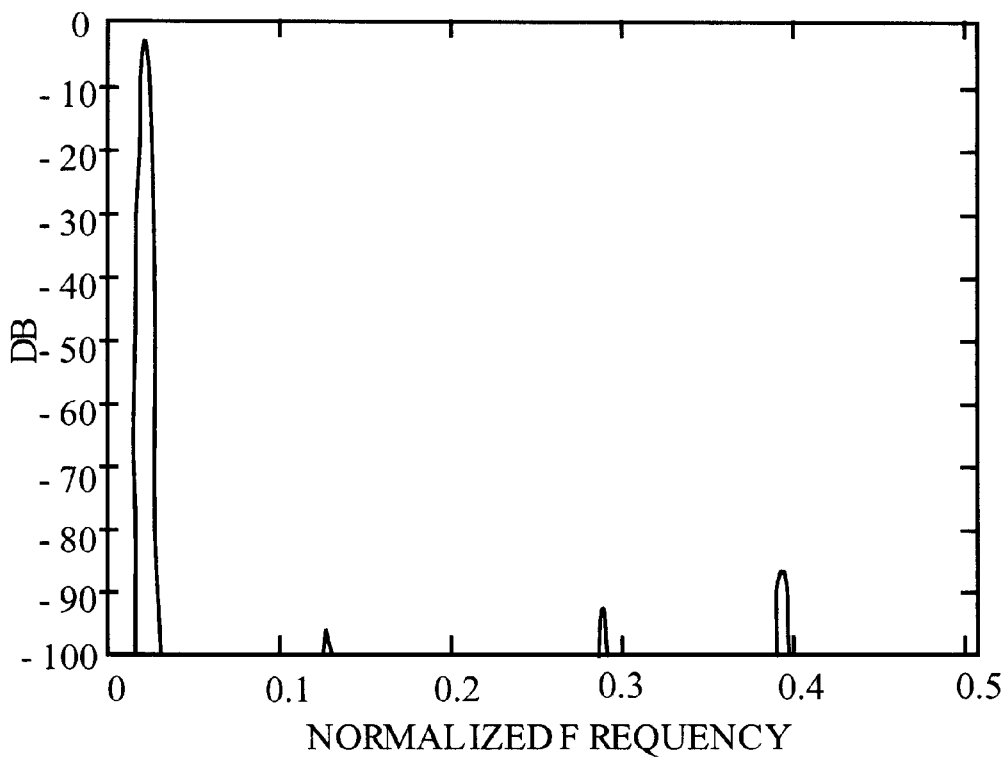
FIG. 11 is a graph that illustrates the signal spectrum produced by a DDS.

FIG. 11 is a graph that illustrates the signal spectrum produced by DDS 400. It can be seen that the artifacts are reduced to a sparse set of harmonics approximately 85 dB below the desired signal level (N=8 and B=10). Greater spectral purity can be achieved by increasing N and B accordingly.

By exploiting quarter-wave symmetry, look-up table 106 can be implemented using only a single block RAM, as compared to the 18 single block RAMs in the dithered DDS 300. However, DDS 400 has adder and multiplier arrangements that are not required by DDS 300. If multipliers 406 and 408 are configured to compute 16×16-bit products, then each will occupy 168 slices. Constant multiplier 404 can be implemented using a 12×16-bit constant coefficient multiplier which requires approximately 60 slices. Adders 410 and 412 can be implemented using a total of 16 slices. Thus, the total cost of the phase error signal processor is 412 slices (168*2+60+16).

The exchange of logic slices for block RAM can be useful for implementing DDSs. For example, a Virtex XCV300 FPGA device provides 16 block RAMs, which is insufficient to support a 96 dB SFDR dithered DDS. However, the error feed-forward DDS can easily be implemented with the XCV300 device since only one block RAM is required and fewer than 20% of the 1536 available logic slices are needed.

The error feed-forward DDS can be designed to operate over a very wide bandwidth. Since there is no feedback employed in the architecture, the arithmetic units can be pipelined to support a high frequency clock. Pipelining refers to inserting registers in an arithmetic unit in order to break a critical path into shorter paths. This permits the unit to operate at a higher clock frequency than would be possible if the unit were not pipelined. The 16×16-bit multipliers, which form the critical path in the design, will operate with clock frequencies in excess of 150 MHz. The Virtex FPGA block RAM supports the associated memory access time.

The present invention is believed to be applicable to a variety of direct digital synthesis circuits and has been found to be particularly applicable and beneficial as implemented in a PLD. While the present invention is not so limited, an appreciation of the present invention has been provided by way of specific examples involving PLDS. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A circuit arrangement for direct digital synthesis, comprising:

a phase accumulator having an input port and an output port;

a quantizer having an input port and an output port, the input port coupled to the output port of the phase accumulator;

a lookup table having first and second output ports and an input port coupled to the output port of the quantizer, the lookup table configured and arranged to output on the first output port a first value being a sine function of an input value to the lookup table and output on the second output port a second value being a cosine function of the input value; and a feed-forward error-correction circuit having input ports coupled to the output ports of the phase accumulator, the quantizer, and the look-up table, the error-correction circuit arranged to determine the error as a function of an input value to and an output value from the quantizer, and to correct the error as a function of output values from the lookup table.

2. The circuit arrangement of claim 1, wherein data values in the lookup table are stored in a block random access memory of a field programmable gate array.

3. The circuit arrangement of claim 2, wherein the look-up table is 512 entries deep.

4. The circuit arrangement of claim 2, wherein the look-up table is 2048 entries deep.

5. The circuit arrangement of claim 1, wherein the error-correction circuit is further arranged to transform the error to units of radians.

6. A method for performing direct digital synthesis, comprising:

accumulating phase increment values, whereby a sequence of accumulated phase values is generated;

quantizing the accumulated phase values, whereby quantized phase values are generated;

generating initial sine values and cosine values from the quantized phase values;

determining phase error values introduced in the quantizing step; and generating corrected sine values and cosine values as functions of the phase error values and initial sine and cosine values.

7. The method of claim 6, further comprising transforming the phase error values to units of radians prior to generating the corrected sine and cosine values.

8. The method of claim 6, wherein generating the initial sine values and cosine values comprises reading the initial sine values and cosine values from a lookup table addressed by quantized phase values.

9. The method of claim 8, wherein reading the initial sine values and cosine values comprises reading the values from a block random access memory of a field programmable gate array.

10. A circuit arrangement for direct digital synthesis, comprising:

a phase accumulator having an input port and an output port;

a quantizer having an input port and an output port, the input port coupled to the output port of the phase accumulator;

a subtracter having an output port and input ports coupled to the output ports of the phase accumulator and the quantizer;

a constant coefficient multiplier having an output port and an input port coupled to the output port of the subtracter;

a lookup table having first and second output ports and an input port coupled to the output port of the quantizer, the lookup table configured and arranged to output on the first output port a first value being a sine function of an input value to the lookup table and output on the second output port a second value being a cosine function of the input value;

a first multiplier having an output port and input ports coupled to the constant coefficient multiplier and the first output port of the lookup table;

a first adder having an output port and input ports coupled to the output port of the first multiplier and the second output port of the lookup table;

a second multiplier having an output port and input ports coupled to the constant coefficient multiplier and the second output port of the lookup table; and a second adder having an output port and input ports coupled to the output port of the second multiplier and the first output port of the lookup table.

11. The circuit arrangement of claim 10, wherein data values in the lookup table are stored in a block random access memory of a field programmable gate array.

12. The circuit arrangement of claim 11, wherein the quantizer provides N-bit output values and the constant coefficient is $2\pi/2^N$, where N is a positive integer.

13. The circuit arrangement of claim 12, wherein the look-up table is 512 entries deep.

14. The circuit arrangement of claim 12, wherein the look-up table is 2048 entries deep.

15. The circuit arrangement of claim 10, wherein the first multiplier and adder and second multiplier and adder are pipelined.

16. The circuit arrangement of claim 10, wherein the quantizer provides N-bit output values and the constant coefficient is $2\pi/2^N$, where N is a positive integer.

17. The circuit arrangement of claim 16, wherein the look-up table is 512 entries deep.

18. The circuit arrangement of claim 16, wherein the look-up table is 2048 entries deep.

19. The circuit arrangement of claim 10, wherein the look-up table is 512 entries deep.

20. The circuit arrangement of claim 10, wherein the look-up table is 2048 entries deep.

* * * * *